United States Patent [19]
Miyaji et al.

[11] Patent Number: 6,046,598
[45] Date of Patent: Apr. 4, 2000

[54] TEST BOARD AND A TEST METHOD USING THE SAME PROVIDING IMPROVED ELECTRICAL CONNECTION

[75] Inventors: Naomi Miyaji; Susumu Moriya; Shigeyuki Maruyama; Makoto Haseyama; Futoshi Fukaya, all of Kawasaki, Japan

[73] Assignee: Fujitsu Limited, Kawasaki, Japan

[21] Appl. No.: 08/852,159

[22] Filed: May 6, 1997

[30] Foreign Application Priority Data

Jan. 31, 1997 [JP] Japan .................................. 9-019214

[51] Int. Cl.[7] .............................. G01R 1/06; G01R 31/26
[52] U.S. Cl. .............................................. 324/755; 324/754
[58] Field of Search ................................... 324/754, 755, 324/760, 765

[56] References Cited

U.S. PATENT DOCUMENTS 5,500,605  3/1996  Chang ...................................... 324/758
5,519,331  5/1996  Cowart et al. .......................... 324/755

FOREIGN PATENT DOCUMENTS

| 59-208469 | 11/1984 | Japan . |
| 63-77129 | 4/1988 | Japan . |
| 5-283490 | 10/1993 | Japan . |
| 7-35771 | 2/1995 | Japan . |

*Primary Examiner*—Glenn W. Brown
*Attorney, Agent, or Firm*—Armstrong, Westerman, Hattori, McLeland & Naughton

[57] ABSTRACT

A test board includes an insulating part provided to face a semiconductor device when the semiconductor device is mounted on the test board, a sloped connection hole formed in the insulating part for accepting a projection electrode when the semiconductor device is mounted on the test board, and a conductive part formed in the insulating part so as to be in contact with and electrically connected to the projection electrode. When the semiconductor device is mounted on the test board, the semiconductor device or the projection electrode is supported by the insulating part.

33 Claims, 13 Drawing Sheets

TEST BOARD AND A TEST METHOD USING THE SAME PROVIDING IMPROVED ELECTRICAL CONNECTION

BACKGROUND OF THE INVENTION

1. Field of the Invention

The present invention generally relates to test boards and test methods using the same, and more particularly, to a test board and a test method using the same suitable for testing a semiconductor chip, a circuit board, or a semiconductor device having projection electrodes.

2. Description of the Related Art

Recently, demands for high-density, high-speed semiconductor devices and further reduction in a size thereof are growing. To meet such demands, a plurality of bare semiconductor chips not sealed in a package or a plurality of semiconductor devices having a ball grid array (BGA) structure may be directly mounted on a circuit board.

According to such a mounting method, the entire device becomes an inferior product if one of the plurality of bare chips or semiconductor devices has a defect. Therefore, a high level of reliability is required in individual bare chips or semiconductor devices.

Hence, a growing importance is attached to a test for determining whether each of the individual bare chips or semiconductor devices is operating properly.

Various methods for testing devices having projection electrodes on the lower surface thereof are proposed and practiced. These devices include a bare chip not sealed in a resin package, a semiconductor device sealed in a resin package, a circuit board on which semiconductor devices are mounted.

When a device having projection electrodes is tested for electrical connection, the tested device should be connected to bumps. Care must be taken so that the bumps may not be deformed or transformed when they are connected to the electrodes.

FIG. 1 shows how a semiconductor device 51 is mounted on a test board 50 according to a related art. As shown in FIG. 1, the test board 50 comprises an insulating plate 53, a conductive part 54 and a land part 55. The insulating plate 53 is embodied, for example, by an insulating tape. A hole 56 is formed in the insulating plate 53 so as to face a projection electrode 52 (bump) provided in the semiconductor device 51.

The conductive part 54 is provided on that surface of the insulating plate 53 opposite to the surface on which the semiconductor device 51 is mounted. The conductive part 54 is connected to a testing apparatus (not shown) so that a test is conducted on the semiconductor device 51 by connecting the conductive part 54 to the associated projection electrode 52.

The land part 55 is provided in the hole 56 formed in the insulating plate 53. The end of the land part 55 projects from the insulating plate 53. The land part 55 is electrically connected to the conductive part 54 so that, by mounting the semiconductor device 51 on the test board 50, the projection electrode 52 comes into contact with the land part 55 and is electrically connected to the conductive part 54.

Therefore, it is possible to test the semiconductor device 51 using the testing apparatus connected to the test board 50. Usually, a pressing mechanism (not shown) presses the semiconductor device 51 against the test board so as to ensure that the projection electrode 52 is electrically connected to the land part 55 properly. Due to the pressing mechanism, an increased amount of connection pressure is provided between the projection electrode 52 and the land part 55 so that the proper electrical connection is established.

With the recent trend for high-density, compact semiconductor devices, the projection electrodes 52 are provided at an increasingly finer pitch. Associated with this, the size of the projection electrode 52 is becoming smaller. As the pitch of the projection electrode 52 becomes finer and the size thereof becomes smaller, the projection electrode becomes less robust until only a small amount of connection pressure may cause the projection electrode 52 to be deformed.

Such deformation occurs due to the spherical configuration of the projection electrode 52. The spherical configuration only provides point contact between an end of the projection electrode 52 and the test board 50. Thus, the aforementioned pressure is concentrated on the contact point.

When the projection electrode 52 is deformed, a shorting may occur between the adjacent projection electrodes. A variation in the height of the projection electrodes 52 may also occur, resulting in some of the projection electrodes 52 not being connected to the mounting board when the semiconductor device 51 is mounted on a board.

SUMMARY OF THE INVENTION

Accordingly, an object of the present invention is to provide a test board and a test method in which the aforementioned disadvantages are eliminated.

Another and more specific object of the present invention is to provide a test board and a test method in which deformation of projection electrodes is prevented from occurring when a test is conducted.

In order to attain the aforementioned objects, the present invention provides a test board for testing a device having projection electrodes and mounted on the test board for testing, comprising: insulating parts facing the device mounted on the test board so as to support one of the device and the projection electrodes of the device when the device is mounted on the test board; connection holes formed in the insulating parts so as to accept the respective projection electrodes; and conductive parts formed on a surface of the respective insulating parts which surface is opposite to a surface facing the device, and electrically connected to the respective projection electrodes by physical contact.

The aforementioned object can also be attained by a test method for testing a device having projection electrodes, by mounting the device on a test board provided with insulating parts facing the device mounted on the test board, connection holes for accepting the projection electrodes, and conductive parts underlying the respective connection holes, comprising the steps of: positioning and inserting each of the second projection electrodes in the connection hole; and supporting one of the device and the projection electrodes of the device by each of the insulating parts, when the device is mounted on the test board.

According to the test board of the present invention, the projection electrode is inserted into the connection hole formed in the insulating part and electrically connected therewith, when the tested device is mounted on the test board. In this state, the tested device or the projection electrode is supported by the insulating part.

In case the tested device is supported by the insulating part, an excessive pressure is prevented from being exerted on the projection electrode so that deformation of the projection electrode is prevented from occurring. In case the projection electrode is supported by the insulating part, the insulating part is not designed to be electrically connected to the projection electrode. Therefore, flexible layout of the insulating part in the test board is possible. It is then possible to provide a relatively wide area of contact between the projection electrode and the insulating part. Accordingly, the pressure (hereinafter, referred to as the connect pressure) exerted on the tested device so as to electrically connect the projection electrode and the test board is properly distributed. In other words, the connect pressure is prevented from being concentrated in an area of contact between the projection electrode and the conductive part, thus preventing deformation of the projection electrode.

The aforementioned object can also be attained by a test board for testing a device having projection electrodes and mounted on the test board for testing, comprising: insulating parts facing the device mounted on the test board so as to support one of the device and the projection electrodes of the device when the device is mounted on the test board; connection holes formed in the insulating parts so as to accept the respective projection electrodes; and conductive parts formed on a surface of the respective insulating parts which surface is opposite to a surface facing the device, and electrically connected to the respective projection electrodes by physical contact, wherein a slit is formed at a position of each of the conductive parts which position comes into contact with the projection electrode, so that the conductive part is deformable at the position.

The aforementioned object can also be attained by a test method for testing a device having projection electrodes, using a test board comprising: insulating parts facing the device mounted on the test board so as to support one of the device and the projection electrodes of the device when the device is mounted on the test board; connection holes formed in the insulating parts so as to accept the respective projection electrodes; conductive parts formed on a surface of the respective insulating parts which surface is opposite to a surface facing the device, and electrically connected to the respective projection electrodes by physical contact, and a slit formed at a position of each of the conductive parts which position comes into contact with the projection electrode, so that the conductive part is deformable at the position, the test method comprising the steps of: positioning and inserting each of the second projection electrodes in the connection hole; and pressing the device against the test board so as to press each of the second projection electrodes against the conductive part and establish an electrical connection between each of the second projection electrodes and the conductive part.

According to the test method of the present invention, the conductive part is deformed so as to cancel the connect pressure exerted on the projection electrode and an area of contact between the conductive part and the projection electrode is increased. Thus, the requirement for prevention of deformation of the projection electrode and improvement of electrical connection between the projection electrode and the conductive part are both met.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

Figure 2A:
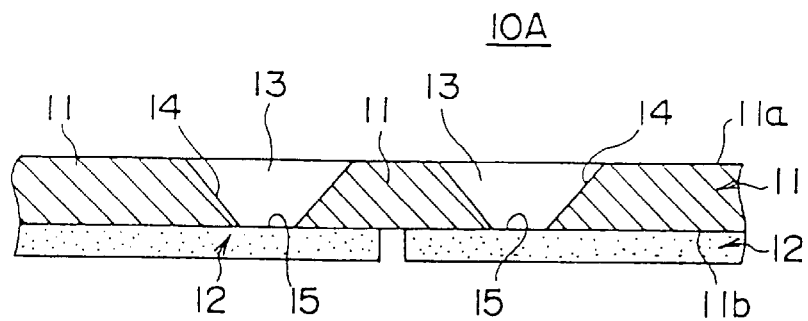
FIG. 2A is a sectional view of a test board according to a first embodiment of the present invention.
Figure 2B:
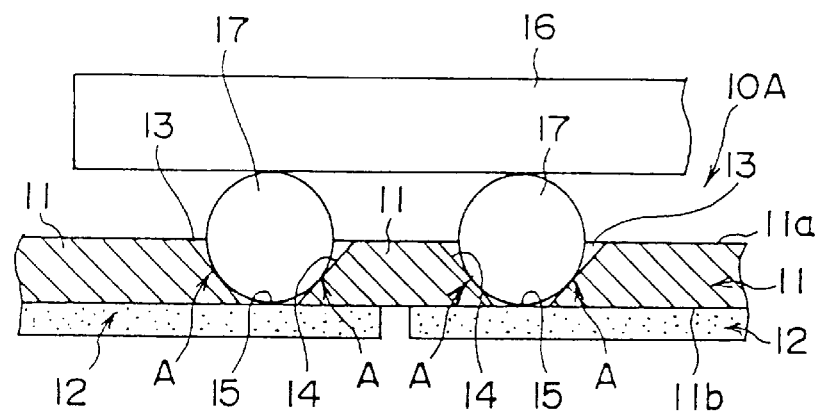
FIG. 2B is a sectional view showing how a tested device is mounted on the test board according to the first embodiment.

FIG. 2A is a sectional view of a test board 10A according to a first embodiment of the present invention. FIG. 2B is a sectional view showing how a semiconductor device 1 is mounted on the test board 10A.

In the description that follows, a semiconductor device having projection electrodes is assumed. However, the test boards according to the present invention are equally used for a bare chip which is not sealed in a resin package, a semiconductor device which is sealed in a resin package and a circuit board on which semiconductor devices are mounted.

As shown in FIG. 2A, the test board 10A has a relatively simple construction comprising an insulating part 11 and a conductive part 12. The insulating part 11 is a film formed of a polyimide or a polyester which are known to have an insulating characteristic. Since the insulating part 11 is formed of a film, it has a certain flexibility.

The insulating part 11 is provided with a connection hole 13. The connection hole 13 has a truncated cone configuration and is formed at a position corresponding to a projection electrode 17 formed in a semiconductor device 16. Accordingly, an inner wall 14 of the connection hole 13 is sloped.

The conductive part 12 is formed of a conductive metal such as a copper (Cu) and a gold (Au) so as to underline the insulating part 11. That is, the conductive part 12 is formed on a rear surface 11b of the insulating part 11 opposite to a front surface 11a (mounting surface) on which the semiconductor device 16 is mounted.

The conductive part 12 may be adhesively attached to the insulating part 11. Alternatively, the conductive part 12 may be attached to the insulating part 11 by vapor deposition or electroless plating. Alternatively, the conductive part 12 may be formed first so that the insulating part 11 is formed thereon.

A portion of the conductive part 12 is located beneath the connection hole 13. Therefore, the conductive part 12 is exposed in the connection hole 13. Hereinafter, the surface of the conductive part 12 exposed in the connection hole 13 is referred to as a conductive surface 15. Thus, as described later, the projection electrode 17 comes into contact with the conductive surface 15 when the semiconductor device 16 is mounted on the test board 10A so that an electrical connection is established between the projection electrode 17 and the conductive part 12.

A description will now be given of functions performed by the elements constituting the test board 10A when the semiconductor device 16 is mounted on the test board 10A.

In the description given below, a ball grid array (BGA) IC having a molded semiconductor chip is taken as an example of the semiconductor device 16. It is assumed that each of the projection electrodes 17 arranged on the underside of the semiconductor device 16 is formed of a solder (Pb/Sn) and has a spherical configuration.

The semiconductor device 16 is mounted on the test board 10A by properly positioning the projection electrode 17 with respect to the connection hole 13 before inserting the projection electrode 17 into the connection hole 13. When the semiconductor device 16 is mounted on the test board 10A, the semiconductor device 16 is pressed by a pressing mechanism (not shown) against the test board 10A.

By pressing the semiconductor device 16 against the test board 10A, an increased amount of contact pressure between the projection electrode 17 and the conductive surface 15 is provided so that proper electrical connection between the projection electrode 17 and the conductive surface 15 is secured. As described previously, in the high-density semiconductor device 16 having the projection electrodes 17 arranged at a relatively fine pitch, the projection electrode 17 may be deformed by being collapsed by the pressure, thus causing various unfavorable effects.

FIG. 2B shows how the semiconductor device 16 is mounted on the test board 10A. As shown in FIG. 2B, when the semiconductor device 16 is mounted on the test board 10A, the projection electrode 17 is inserted into the connection hole 13 formed in the insulating part 11 so as to be electrically connected to the conductive part 12 (conductive surface 15). In this state, the projection electrode 17 is in contact with the inner wall of the connection hole 13. Thus, the projection electrode 17 (semiconductor device 16) is supported by the insulating part 11.

As described previously, the inner wall 14 of the connection hole 13 is sloped. Accordingly, the projection electrode 17 and the inner wall 14 of the connection hole 13 are in annular contact with each other, as indicated by the arrow A in FIG. 2B.

Figure 1:
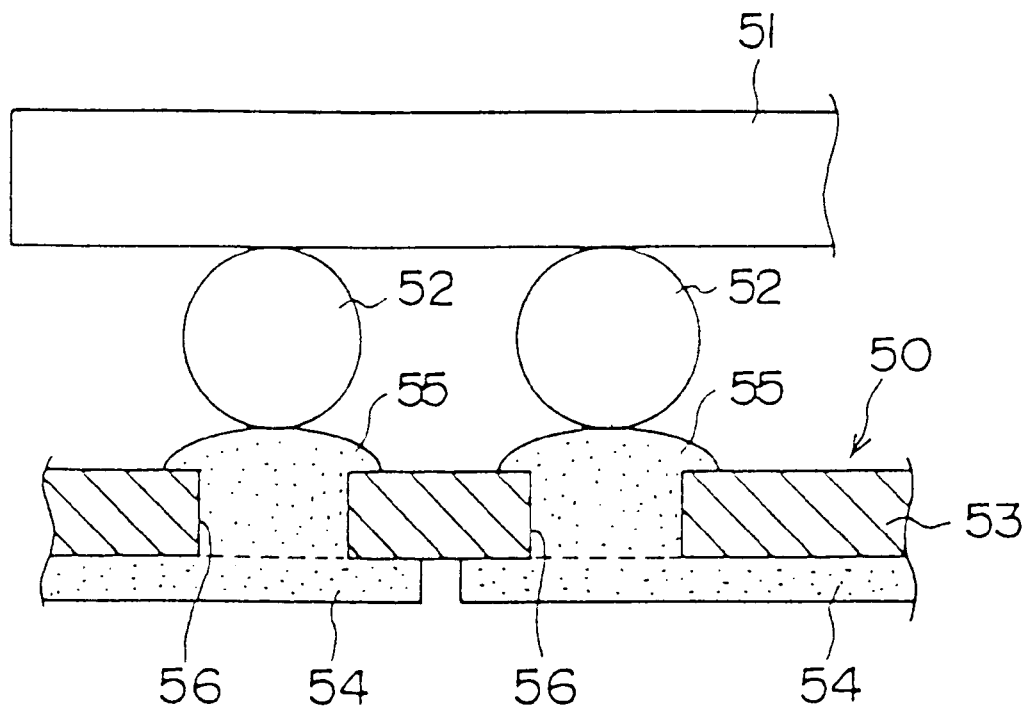
FIG. 1 shows a test board according to a related art.

In other words, the projection electrode 17 and the inner wall 14 are in line contact instead of point contact of the related art. The contact area between the projection electrode 17 and the inner wall 14 is larger than the corresponding area in the test board 50 according to the related art (see FIG. 1). The connect pressure is thus properly distributed, i.e. the connect pressure is prevented from being concentrated at the end of the projection electrode 17. Thus, the projection electrode 17 is prevented from being deformed.

Since the insulating part 11 is not electrically connected to the projection electrode 17, flexible layout of the insulating part 11 is possible. Therefore, it is possible to efficiently distribute the connect pressure by appropriately selecting the slope angle of the inner wall 14. It is also possible to provide a large area of contact between the projection electrode 17 and the inner wall 14 by appropriately selecting the configuration of the inner wall 14. The latter construction will be described in detail later.

A description will now be given of a test board according to second through fifth embodiments of the present invention.

FIGS. 3 through 6 are sectional views of test boards 10B, 10C, 10D and 10E, respectively, according to the second through fifth embodiments, respectively. In the following description and associated drawings, those components that are the same as the corresponding components shown in FIGS. 2A and 2B are designated by the same reference numerals and the description thereof is omitted.

The second through fifth embodiments feature formation of projecting connection parts 18, 19, 20 and 21, respectively, on the conductive surface 15 of the conductive part 12, that is, at the bottom of the connection hole 13. The projecting connection parts 18, 19, 20 and 21 are electrically connected to the conductive part 12 and project from the conductive surface 15 toward the connection hole 13.

Figure 3:
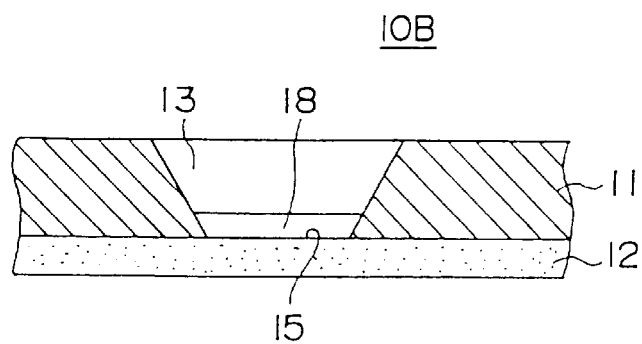
FIG. 3 is a sectional view of a test board according to a second embodiment of the present invention.

FIG. 3 shows the test board 10B according to the second embodiment. In the test board 10B, a non-wettable member 18 is provided as the projecting connection part.

Assuming that the projection electrode 17 is formed of a solder (Pb/Sn) and the conductive part 12 is formed of a gold (Au), a chemical reaction occurs between the solder and the gold. The projection electrode 17 and the conductive part 12 are jointed together, resulting in poor electrical connection between the projection electrode 17 and the conductive part 12 or difficulty in removing the semiconductor device 16 from the test board after a test.

The non-wettable member 18 provided on the conductive plate 15 as the projecting connection part prevents the projection electrode 17 and the conductive part 12 from being joined together even when the projection electrode 17 is formed of a solder (Pb/Sn) and the conductive part 12 is formed of a gold (Au). The non-wettable member 18 may be formed of a chromium (Cr), for example.

By providing the non-wettable member 18 (projecting connection part) formed of a material different from the material forming the conductive part 12, proper electrical connection between the projection electrode 17 and the conductive part 12 is secured.

Figure 4:
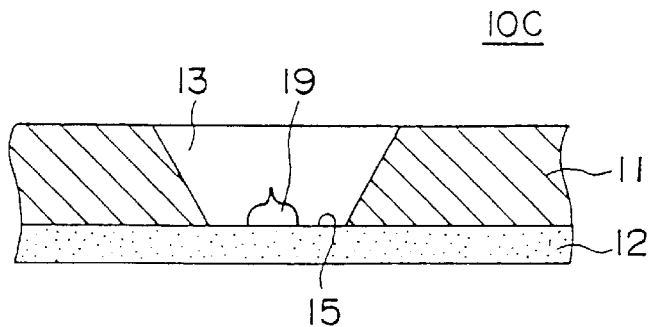
FIG. 4 is a sectional view of a test board according to a third embodiment of the present invention.

FIG. 4 shows the test board 10C according to the third embodiment. The test board 10C features formation of a stud bump 19 used as a projecting connection part.

The stud bump 19 is easily formed using wire-bonding technology. The stud bump 19 is configured to have a sharp end so that the projection electrode 17 inserted into the connection hole 13 is pierced by the sharp end of the stud bump 19.

Compared with the first embodiment where the projection electrode 17 comes into point contact with the conductive surface 15 for electrical connection therewith, the second embodiment provides a larger area of contact between the projection electrode 17 and the stud bump 19. Since the stud bump 19 is in electrical connection with the conductive part 12, the second embodiment ensures that the projection electrode 17 and the conductive part 12 are electrically connected to each other properly. The sharp end is formed as an outcome of a process for forming the stud bump 19. Therefore, it is not necessary to provide an extra step for forming the sharp end.

Figure 5:
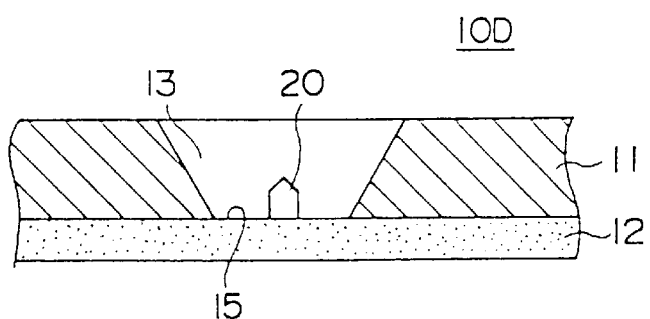
FIG. 5 is a sectional view of a test board according to a fourth embodiment of the present invention.

FIG. 5 shows the test board 10D according to the fourth embodiment. The test board 10D features formation of a metal pin (conductive pin) as a projecting connection part. The material forming the metal pin 20 may be identical to or different from the material forming the conductive part 12. As described in the second embodiment, chemical reaction between the metal pin 20 and the projection electrode 17 is prevented by appropriately selecting the material forming the metal pin 20.

The metal pin 20 may be secured on the conductive surface 15 using, for example, an conductive adhesive. Alternatively, the metal pin 20 may be formed by precipitation. The metal pin 20 has a sharp end that pierces the projection electrode 17 when the projection electrode 17 is inserted into the connection hole 13.

Like the third embodiment, the fourth embodiment provides a relatively large area of contact between the projection electrode 17 and the metal pin 20. Accordingly, proper electrical connection between the conductive part 12 and the projection electrode 17 is secured.

Figure 6:
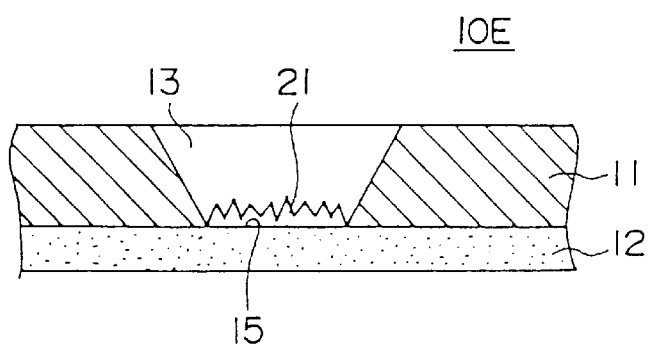
FIG. 6 is a sectional view of a test board according to a fifth embodiment of the present invention.

FIG. 6 shows the test board 10E according to the fifth embodiment. The test board 10E features formation of a coarse-surfaced member 21 as a projecting connection part. The material forming the coarse-surfaced member 21 may be identical to or different from the material forming the conductive part 12. Chemical reaction between the coarse-surfaced member 21 and the projection electrode 17 is prevented by appropriately selecting the material forming the coarse-surfaced member 21.

The coarse-surfaced member 21 has a jagged top surface including fine pinhead projections. The coarse-surfaced member 21 having such a construction may be formed on the conductive surface 15 by the following steps. First, a conductive metal is formed on the conductive surface 15 by plating or vapor deposition. Then, the surface of the conductive metal is turned into a coarse surface by etching or blasting.

The fine pinhead projections formed on the surface of the coarse-surfaced member 21 pierce the projection electrode 17 by inserting the projection electrode 17 into the connection hole 13.

Like the third and fourth embodiments, the fifth embodiment provides a relatively large area of contact between the projection electrode 17 and the metal pin 20. Accordingly, proper electrical connection between the conductive part 12 and the projection electrode 17 is secured.

A description will now be given of a sixth embodiment of the present invention.

Figure 7:
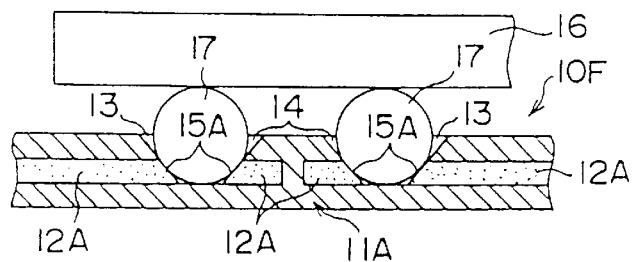
FIG. 7 is a sectional view of a test board according to a sixth embodiment of the present invention.

FIG. 7 shows a test board 10F according to the sixth embodiment. The test board 10F features formation of a conductive part 12A inside an insulating part 11A and exposure of the conductive part 12A from the inner wall 14 of the connection hole 13.

More specifically, a conductive surface 15A is exposed in the inner wall 14. As a result, the conductive part 12A is electrically connected to the side of the projection electrode 17. The conductive part 12A may be formed inside the insulating part 11A using, for example, the technology for forming a stacking flexible board.

By forming the conductive part 12A inside the insulating part 11A so as to produce the conductive surface 15A exposed from the inner wall 14 of the connection hole 13, the conductive part 12A is in contact with the side of the projection electrode 17.

Unlike the foregoing embodiments, the end of the projection electrode 17 does not come into contact with the conductive part 12A. The connect pressure is not concentrated on the end of the projection electrode 17. Moreover, the conductive part 12A is in annular contact with the projection electrode 17. The contact area between the conductive part 12A and the projection electrode 17 is larger than the corresponding area according to the related art so that the connect pressure is distributed. Thus, the projection electrode 17 is prevented from being deformed at its contact with the conductive part 12A.

A description will now be given of a seventh embodiment of the present invention.

Figure 8:
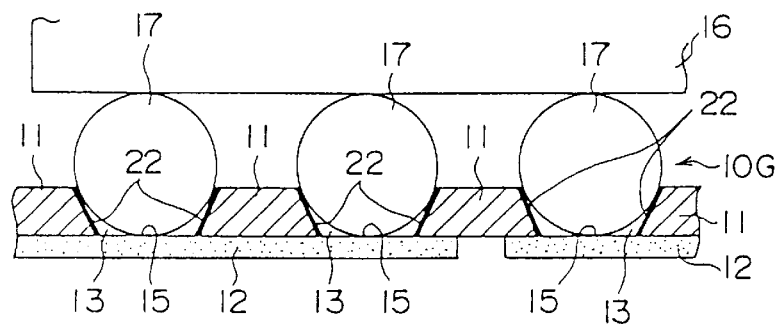
FIG. 8 is a sectional view of a test board according to a seventh embodiment of the present invention.

FIG. 8 shows a test board 10G according to the seventh embodiment. The test board 10G features formation of a conductive film 22 on the inner wall of the connection hole 13.

The conductive film 22 is electrically connected to the conductive part 12 at its lower end. The conductive film 22 may be formed on the inner wall of the connection hole 13 by electroless plating or vapor deposition.

By forming the conductive film 22 on the inner wall of the connection hole 13, the area providing electrical connection between the projection electrode 17 and the conductive part 12 is increased. More specifically, the test board 10G according to the seventh embodiment ensures that the projection electrode 17 is in contact with the conductive film 22 at its side as well as the conductive surface 15 at its end.

Thus, the area of contact between the projection electrode 17 and the conductive part 12 is increased. As a result of this, proper electrical connection between the projection electrode 17 and the conductive part 12 is secured even with a reduced connect pressure. Accordingly, the projection electrode 17 is prevented from being deformed and electrical connection between the projection electrode 17 and the conductive part 12 is improved.

A description will now be given of an eighth embodiment of the present invention.

Figure 9:
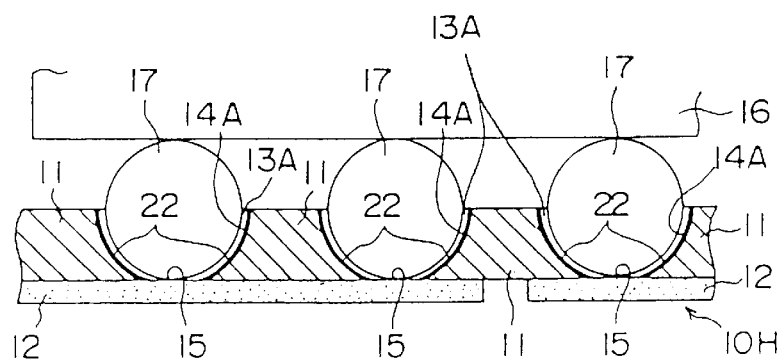
FIG. 9 is a sectional view of a test board according to an eighth embodiment of the present invention.

FIG. 9 shows a test board 10H according to the eighth embodiment. The test board 10H features hemispherical formation of the inner wall of a connection hole 13A so as to fit the spherical configuration of the projection electrode 17.

The hemispherical connection hole 13A may be formed in the insulating part 11 by using a thermal tool having a configuration adapted for the configuration of the projection electrode 17. By pressing the thermal tool against the insulating part 11, the hemispherical configuration results. A die having a configuration adapted for the configuration of the projection electrode 17 may be used so that the connection hole 13A is formed simultaneously as the insulating part 11 is formed.

By configuring the inner wall of the connection hole 13A to adapt for the configuration of the projection electrode 17, a relatively large area of contact between the projection electrode 17 and the inner wall of the connection hole 13A results. Thus, the connect pressure is properly distributed and deformation of the projection electrode 17 is prevented even more thoroughly than the foregoing embodiments.

Like the seventh embodiment, the eighth embodiment provides the conductive film 22 on the inner wall of the connection hole 13A. Since the inner wall of the connection hole is configured to adapt for the configuration of the projection electrode 17, the area of contact between the projection electrode 17 and the conductive film 22 is larger than the corresponding contact area according to the seventh embodiment.

Thus, according to the eighth embodiment, the projection electrode 17 is electrically connected to the conductive part 12 properly even with a smaller connect pressure than the connect pressure required in the seventh embodiment. Accordingly, deformation of the projection electrode 17 is more properly prevented and electrical connection between the projection electrode 17 and the conductive part 12 is more properly secured than the foregoing embodiment.

A description will now be given of the ninth embodiment of the present invention.

Figure 10:
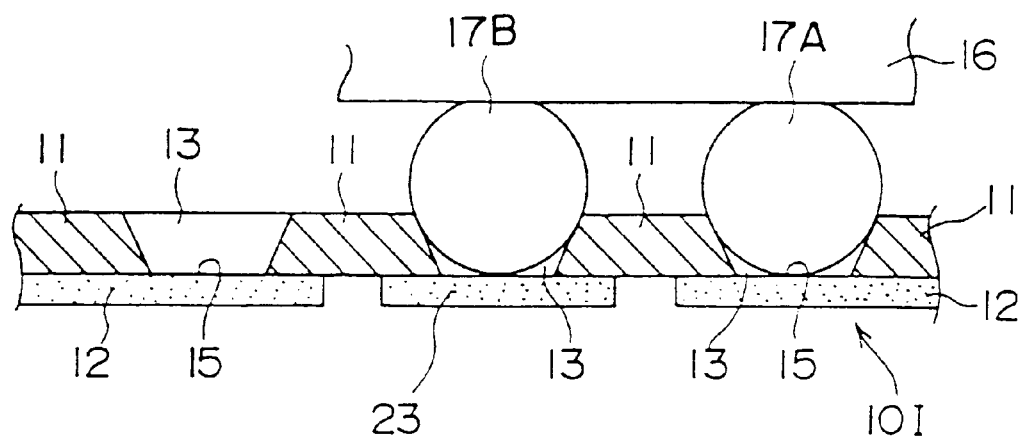
FIG. 10 is a sectional view of a test board according to a ninth embodiment of the present invention.

FIG. 10 shows a test board 10I according to the ninth embodiment. While the semiconductor device 16 is provided with a large number of projection electrodes, all of the projection electrodes may be used in a test conducted on the semiconductor device 16 or only some of the projection electrodes 17 may be used.

For example, in case the semiconductor device 16 is a memory, some of the projection electrodes 17 are not used in a test. In the description that follows, those projection electrodes that are used in a test will be referred to as tested projection electrodes 17A and those that are not used will be referred to as non-connection projection electrodes 17B.

The conductive part 12 that is connected to the non-connection projection electrode 17B will be specifically referred to as non-connection conductive part 23. If the non-connection conductive part 23 is relatively elongated on the test board, disturbances entering through the non-connection conductive part 23 may affect the test, resulting in a less accurate test result.

Accordingly, the test board 10I is constructed such that the non-connection conductive part 23 connected to the non-connection projection electrode 17B is electrically separated from the testing conductive part 12 connected to the tested projection electrode 17A.

More specifically, the test board 10I is constructed such that the non-connection conductive part 23 has a minimal area only large enough to cover the bottom of the connection hole into which the non-connection projection electrode 17B is inserted. As a result of such a construction, the non-connection conductive part 23 and the testing conductive part 12 are electrically separated from each other and the non-connection conductive part 23 has a minimum extension. Thus, disturbances are prevented from entering the testing conductive part 12 via the non-connection conductive part 23. Consequently, precision of the test is improved.

A description will now be given of the tenth embodiment of the present invention.

Figure 11:
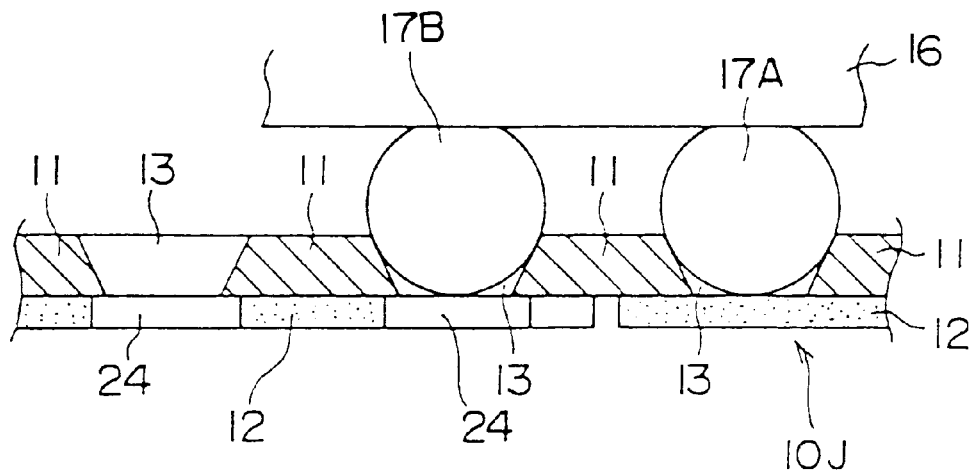
FIG. 11 is a sectional view of a test board according to a tenth embodiment of the present invention.

FIG. 11 shows a test board 10J according to the tenth embodiment. The test board 10J has a variation of the construction described in the ninth embodiment for preventing disturbances from entering the testing conductive part 12.

The test board 10J according to the tenth embodiment is constructed such that the conductive part 12 is provided only in the connection hole 13 into which the tested projection electrode 17A is inserted.

More specifically, the test board 10J is constructed such that a through hole 24 is provided in the conductive part 12 so as to face the non-connection projection electrode 17B. Thus, the non-connection projection electrode 17B and the conductive part 12 are not connected to each other when the semiconductor device 16 is not mounted on the test board 10J.

According to such a construction, the non-connection conductive part that may allow disturbances from entering the testing conductive part is absent in the test board 10J. Accordingly, disturbances are prevented from entering the conductive part 12 due to the non-connection projection electrode 17B, thereby improving precision of the test.

A description will now be given of eleventh through thirteenth embodiments according to the present invention.

Figure 12:
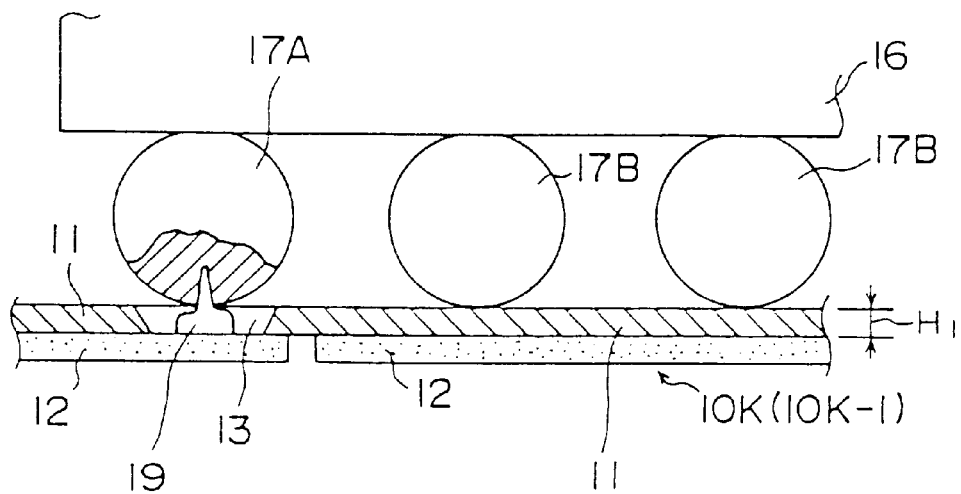
FIG. 12 is a sectional view of a test board according to an eleventh embodiment of the present invention.
Figure 13:
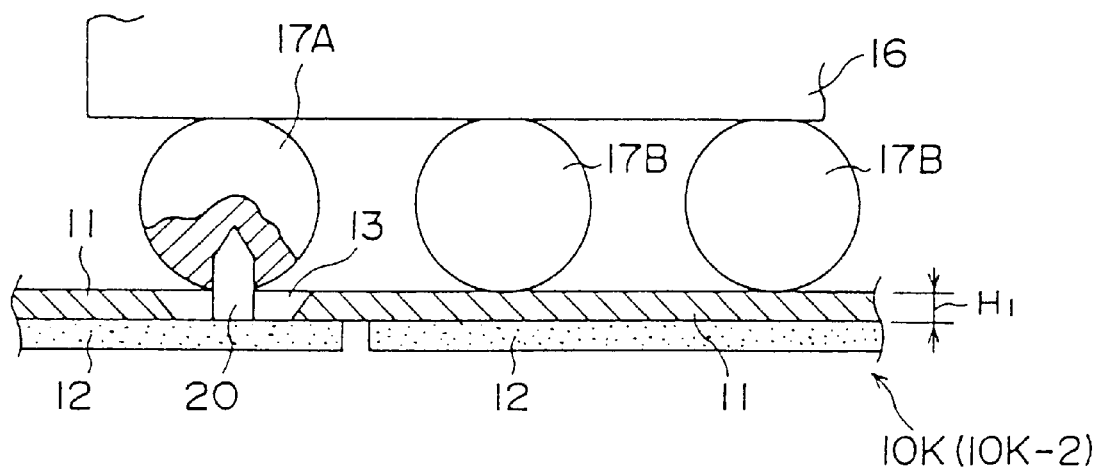
FIG. 13 is a sectional view of a test board according to a twelfth embodiment of the present invention.
Figure 14:
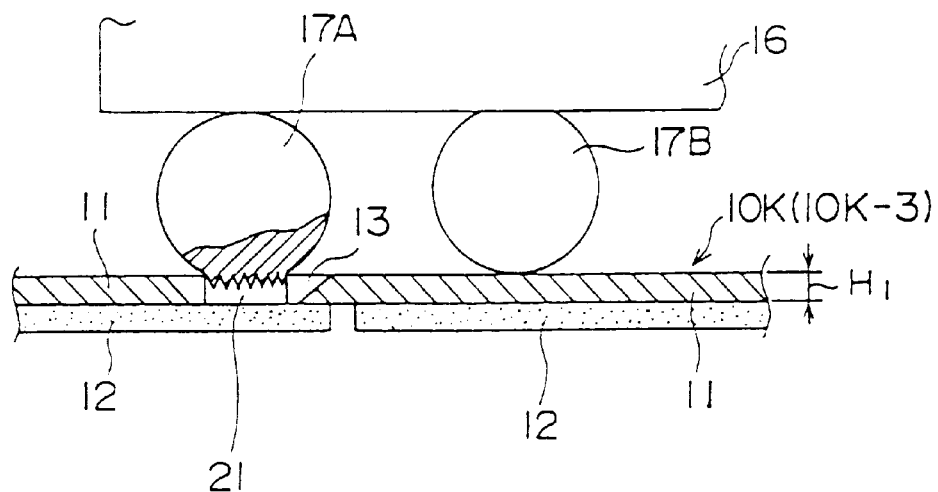
FIG. 14 is a sectional view of a test board according to a thirteenth embodiment of the present invention.

FIGS. 12 through 14 show test boards 10K-1, 10K-2 and 10K-3, respectively, according to the eleventh through thirteenth embodiments, respectively. According to the eleventh through thirteenth embodiments, the connection hole 13 is formed only at a position that faces the tested projection electrode 17A. The connection hole 13 is not formed at a position that faces the non-connection projection electrode 17B.

The projecting connection parts 19, 20 and 21 electrically connected to the conductive part 12 are provided in the connection hole 13 of the eleventh through thirteenth embodiments, respectively. The thickness (indicated by the arrow $H_1$ in FIGS. 12 through 14) of the insulating part 11 is set such that the tested projection electrode 17A is connected to the respective one of the projecting connection parts 19, 20 and 21 when the non-connection projection electrode 17B is in contact with the insulating part 11.

According to the above-described construction, the tested projection electrode 17A is electrically connected to the respective one of the projecting connection parts 19, 20 and 21 when the semiconductor device 16 is mounted on the respective one of the test boards 10K-1, 10K-2 and 10K-3.

When the semiconductor device 16 is mounted on the respective one of the test boards 10K-1, 10K-2 and 10K-3, the non-connection projection electrode 17B is in contact with the upper major surface of the insulating part 11. Contact of the non-connection projection electrode 17B with the upper major surface of the insulating part 11 ensures that the semiconductor device 16 is supported on the insulating part 11 by the non-connection projection electrode 17B.

Therefore, the connect pressure exerted on the semiconductor device 16 and applied to the tested projection electrode 17A is moderated because the semiconductor device 16 is supported on the insulating part 11 due to the contact of the non-connection projection electrode 17B with the insulating part 11. Thus, deformation of the tested projection electrode 17A is prevented.

Since a plurality of the non-connection projection electrodes 17B supporting the semiconductor device 16 are usually provided, the connect pressure is properly distributed depending on the number of non-connection projection electrodes 17B. Thus, the connect pressure applied to the individual non-connection projection electrode 17B is reduced. Thus, deformation of the non-connection projection electrode 17B supporting the semiconductor 16 is prevented.

The non-connection conductive part is absent at positions where the non-connection projection electrode 17B is in contact with the insulating part 11. That is, the non-connection projection electrode 17B is electrically separated from the testing conductive part 12. Accordingly, disturbances are prevented from entering the testing conductive part 12, thus improving precision of the test.

FIG. 12 shows the test board 10K-1 according to the eleventh embodiment. The test board 10K-1 features formation of the stud bump 19 as the projecting connection part. FIG. 13 shows the test board 10K-2 according to the twelfth embodiment. The test board 10K-2 features formation of the metal pin 20 as the projecting connection part. FIG. 14 shows the test board 10K-3 according to the thirteenth embodiment. The test board 10K-3 features formation of the coarse-surfaced member 21 as the projecting connection part.

A description will now be given of a fourteenth embodiment of the present invention.

Figure 15:
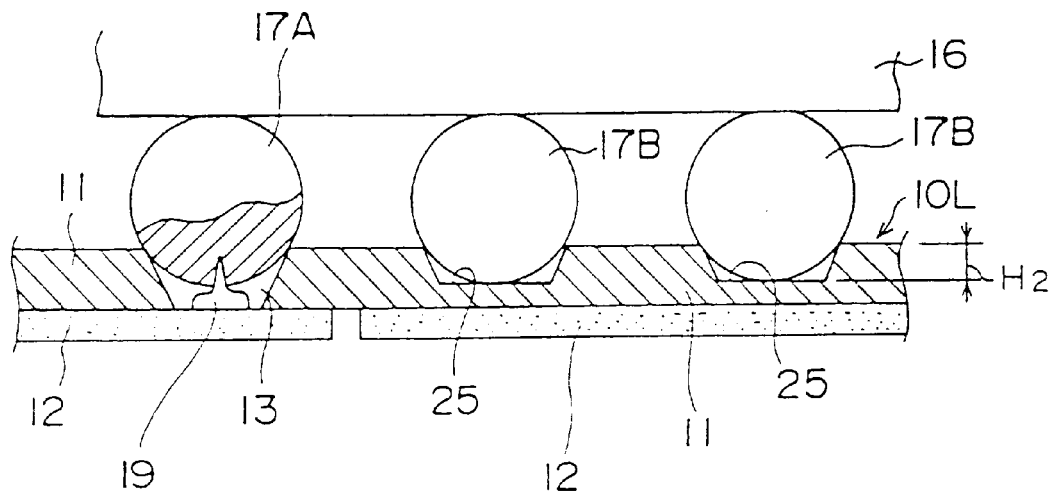
FIG. 15 is a sectional view of a test board according to a fourteenth embodiment of the present invention.

FIG. 15 shows a test board 10L according to the fourteenth embodiment. The fourteenth embodiment provides a variation that achieves the same objective as the test boards 10K1, 10K2 and 10K3 according to the eleventh through thirteenth embodiments, respectively.

The test board 10L features formation of the connection hole 13 in the insulating part 11 only at a position facing the tested projection electrode 17A and formation of a recess 25 at a position facing the non-connection projection electrode 17B.

The depth of the recess 25 (indicated by the arrow $H_2$ in FIG. 15) is set such that the tested projection electrode 17A is connected to the projecting connection part (in FIG. 15, the stud bump 19 is shown as an example) when the non-connection projection electrode 17B is in contact with the bottom of the recess 25.

When the semiconductor device 16 is mounted on the test board 10L, the tested projection electrode 17A and the stud bump 19 (projecting connection part) are electrically connected to each other and the non-connection projection electrode 17B is in contact with the recess 25 formed in the insulating part 11.

Since the non-connection projection electrode 17B is in contact with the bottom of the recess 25 formed in the insulating part 11, the semiconductor device 16 is supported on the insulating part 11 by the non-connection projection electrode 17B. The connect pressure exerted on the semiconductor device 16 and applied to the tested projection electrode 17A is moderated because the semiconductor device 16 is supported on the insulating part 11 as a result of the contact between the non-connection projection electrode 17B and the insulating part 11. Accordingly, deformation of the tested projection electrode 17B is prevented.

Since a plurality of the non-connection projection electrodes 17B are usually provided, the connect pressure is properly distributed depending on the number of non-connection projection electrodes 17B, resulting in a reduced connect pressure applied to the individual non-connection projection electrode 17B. Thus, deformation of the non-connection projection electrode 17B is prevented.

Like the eleventh through thirteenth embodiments, the fourteenth embodiment ensures that the non-connection conductive part is not formed at a position at which the non-connection projection electrode 17B comes into contact with the insulating part 11. Accordingly, disturbances are prevented from entering the testing conductive part 12, thus improving precision of the test.

A description will now be given of a test method using a test board 10M.

Figure 16A:
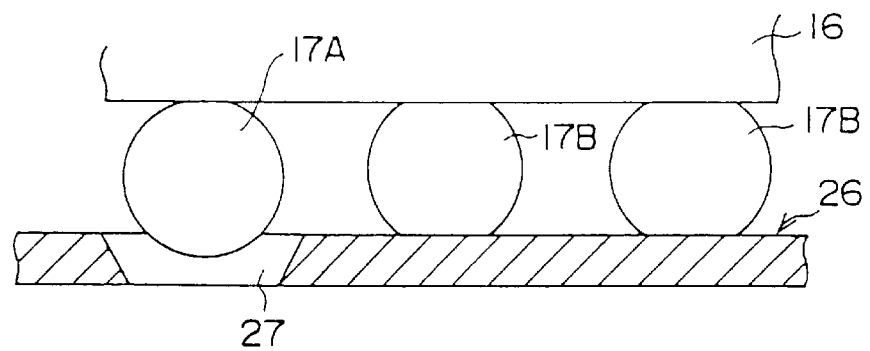
FIGS. 16A and 16B show a test method using a test board of the present invention.
Figure 16B:
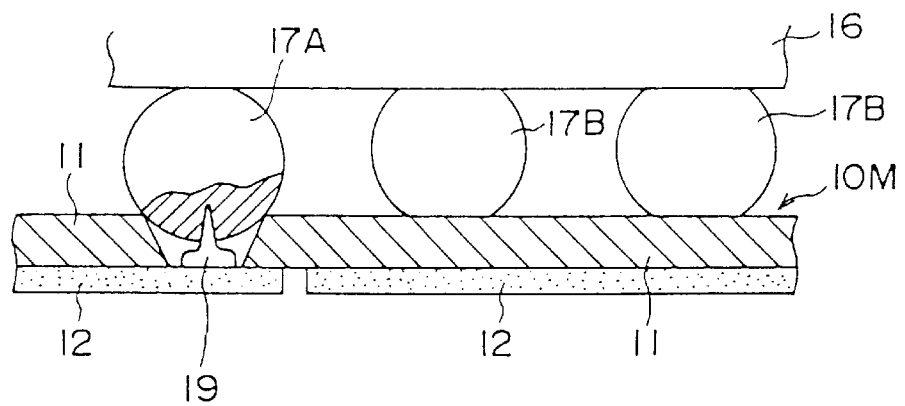

FIGS. 16A and 16B show a test method using the test board 10M. As shown in FIG. 16A, a molded plate 26 having an opening 27 only at a position facing the tested projection electrode 17A is prepared. By pressing the semiconductor device 16 against the molded plate 26, the non-connection projection electrode 17B is deformed by being collapsed by the pressure so as to have a reduced height.

The tested projection electrode 17A, located in the opening 27 formed in the molded plate 26, does not have its height changed. The molded plate 26 may be formed of a material harder than the material (for example, solder) forming the projection electrode. More specifically, the molded plate 26 may be formed of a ceramic or a stainless steel.

Subsequently, the semiconductor device 16 is mounted on the test board 10M such that the tested projection electrode 17A is positioned in the connection hole 13 formed in the test board 10M. Like the test boards 10B, 10C, 10D and 10E according to the third through fifth embodiments, respectively, the test board 10M has a projecting connection part (18, 19, 20 and 21) formed inside the connection hole 13 (FIG. 16B shows the stud bump 19). The connection hole 13 is formed only at a position facing the tested projection electrode 17A.

Subsequently, the semiconductor device 16 is pressed against the test board 10M so that the stud bump 19 pierces the tested projection electrode 17A, resulting in an electrical connection between the tested projection electrode 17A and the conductive part 12. The non-connection projection electrode 17B smaller in height than the tested projection electrode 17A comes into contact with the upper major surface of the insulating part 11. Accordingly, the semiconductor device 16 is supported by the insulating part 11.

Accordingly, the connect pressure exerted on the tested device and applied to the tested projection electrode 17A is moderated because the semiconductor device 16 is supported on the insulating part due to the contact between the non-connection projection electrode 17B and the insulating part 11. Thus, the connect pressure is prevented from being concentrated in the tested projection electrode 17A and deformation of the tested projection electrode 17A is prevented.

Since a plurality of the non-connection projection electrodes 17B are usually provided, the connect pressure is properly distributed so that the connect pressure exerted on the individual non-connection projection electrodes 17B is reduced. Accordingly, an excessive deformation of the non-connection projection electrode 17B is prevented even when the semiconductor device 16 is supported by the non-connection projection electrode 17B.

According to the test method described with reference to FIGS. 16A and 16B, the non-connection projection electrode 17B is deformed. However, such a deformation of the 17B non-connection projection electrode 17B is insignificant as compared to the deformation caused by the concentration of the connect pressure. It is also to be noted that a forming process for providing the spherical configuration of the projection electrode 17 is performed at a stage toward the end of a semiconductor fabrication process.

As has been described, the deformation caused in the non-connection projection electrode 17B according to the test method of FIGS. 16A and 16B is insignificant. Therefore, any deformation caused as a result of the test method of FIGS. 16A and 16B is properly remedied by the forming process. However, the deformation caused by the concentration of the connect pressure can not be remedied by the forming process. Accordingly, the test method of FIGS. 16A and 16B lends itself to preventing deformation of the non-connection projection electrode 17 due to the connect pressure.

A description will now be given of a fifteenth embodiment of the present invention.

Figure 17:
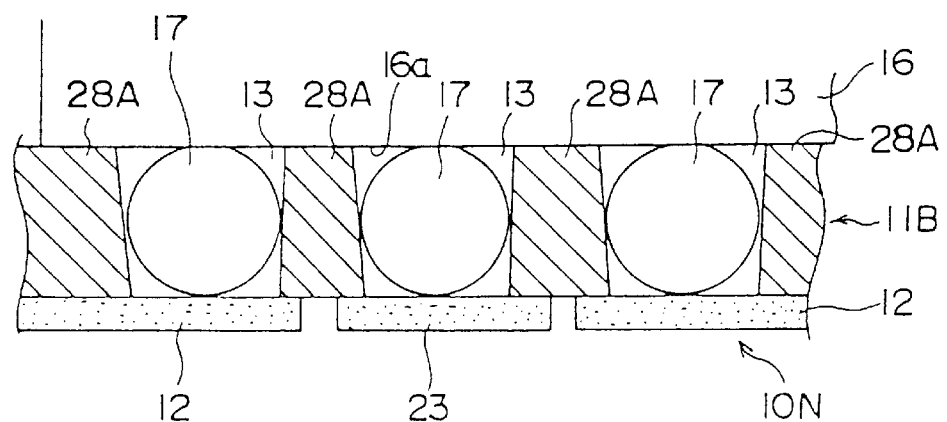
FIG. 17 is a sectional view of a test board according to a fifteenth embodiment of the present invention.
Figure 18A:
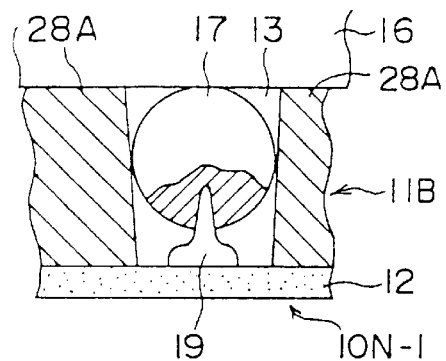
FIGS. 18A, 18B and 18C show variations of the test board according to the fifteenth embodiment.
Figure 18B:
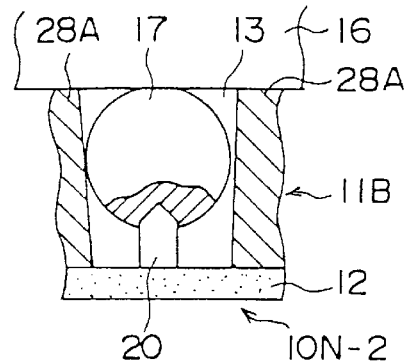
Figure 18C:
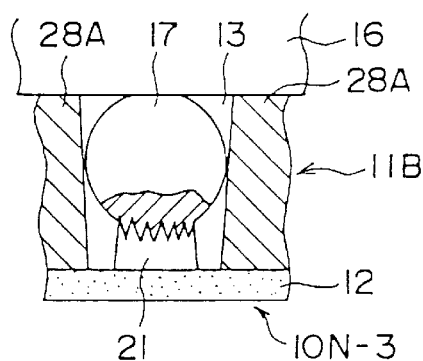

FIG. 17 shows a test board 10N according to the fifteenth embodiment. FIGS. 18A, 18B and 18C show test boards 10N-1, 10N-2 and 10N-3, respectively, according to the fifteenth embodiment. The test boards 10N, 10N-1, 10N-2 and 10N-3 feature formation of a supporting part 28A in an insulating part 11B.

The supporting part 28A is formed to be integral with the insulating part 11B. The supporting part 28A is an upward extension of the insulating part 11B. The supporting part 28A is constructed such that its end comes into contact with or is at a minute distance from a bottom 16a of the semiconductor device 16 when the semiconductor device 16 is properly mounted on the test board 10N.

The supporting part 28A is provided between the adjacent connection holes 13 so that, when the semiconductor device 16 is mounted on the test board 10N, the projection electrode 17 is located between the adjacent supporting parts 28A.

According to the test board 10N described above, the semiconductor 16, mounted properly on the test board 10N, is supported by the insulating part 11B via the supporting part 28A. Accordingly, the connect pressure exerted on the semiconductor device 16 is distributed among the plurality of supporting parts 28A so that the connect pressure is prevented from being concentrated in the projection electrode 17. Thus, the connect pressure applied to the projection electrode 17 is moderated and deformation of the projection electrode 17 is prevented.

According to the fifteenth embodiment, the supporting part 28A is provided between the adjacent connection holes 13. Therefore, the semiconductor device 16 is supported at a plurality of positions near the projection electrodes 17 so that the connect pressure applied to the projection electrode 17 is properly moderated.

In each of the test boards 10N-1, 10N-2 and 10N-3 shown in FIGS. 18A, 18B and 18C, respectively, a projecting connection part is provided. FIG. 18A shows the test board 10N-1 in which the stud bump 19 is used as the projecting connection part. FIG. 18B shows the test board 10N-2 in which the metal pin 20 is used as the projecting connection part. FIG. 28C shows the test board 10N-3 in which the coarse-surfaced member 21 is used as the projecting connection part.

By constructing the end of the supporting part 28A to be in contact with or at a minute distance from the bottom 16a of the semiconductor device 16 when the semiconductor device 16 is properly mounted, the test boards 10N-1, 10N-2 and 10N-3 provide the same effect as the test board 10N shown in FIG. 17.

A description will now be given of a sixteenth embodiment of the present invention.

Figure 19:
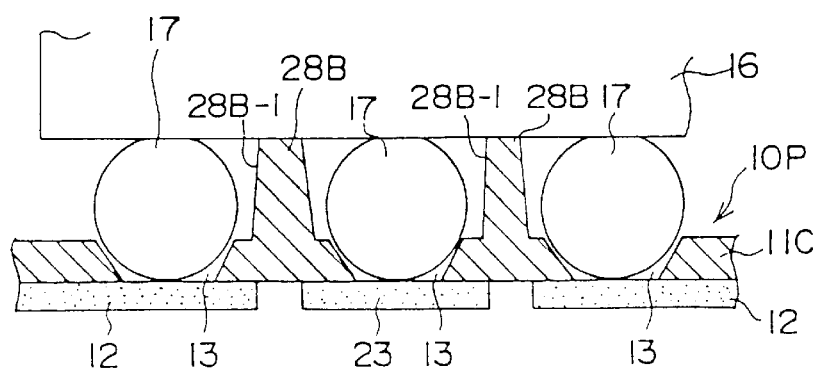
FIG. 19 is a sectional view of a test board according to a sixteenth embodiment of the present invention.

FIG. 19 shows a test board 10P according to the sixteenth embodiment. The sixteenth embodiment provides a variation that achieves the same effect as the test boards 10N, 10N-1, 10N-2 and 10N-3 according to the fifteenth embodiment.

A supporting part 28B is an upward extension of an insulating part 11C. The supporting part 28B is constructed such that its end comes into contact with or is at a minute distance from the bottom 16a of the semiconductor device 16 when the semiconductor device 16 is properly mounted on the test board 10P. Further, the supporting part 28B is located between the adjacent connection holes 13.

In the test board 10P, the supporting part 28B is configured to be smaller in width than the supporting part 28A of the test boards 10N, 10N-1, 10N-2 and 10N-3 according to the fifteenth embodiment. The supporting part 28B is provided with a tapered surface 28B-1 narrowing toward the bottom.

The tapered surface 28B-1 guides the projection electrode 17 when the semiconductor device 16 is being mounted on the test board 10P. Accordingly, mounting of the semiconductor device 16 on the test board 10P is performed easily.

A description will now be given of a seventeenth embodiment of the present invention.

Figure 20:
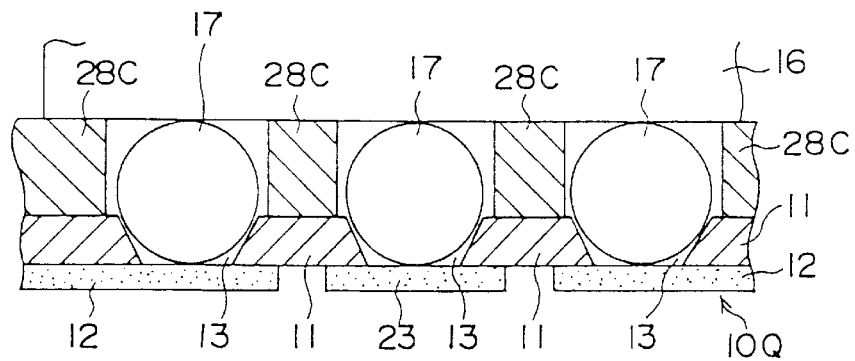
FIG. 20 is a sectional view of a test board according to a seventeenth embodiment of the present invention.

FIG. 20 shows a test board 10Q according to the seventeenth embodiment. The test board 10Q achieves the same objective as the test boards 10N, 10N-1, 10N-2 and 10N-3 according to the fifteenth embodiment.

A supporting part 28C is an upward extension of the insulating part 11. The supporting part 28C is constructed such that its end comes into contact with or is at a minute distance from the bottom 16a of the semiconductor device 16 when the semiconductor device 16 is mounted on the test board 10Q. Further, the supporting part 28C is provided between the adjacent connection hole 13.

It is to be noted that the supporting part 28C of the test board 10Q is not integral with the insulating part 11. The supporting part 28C may be adhesively attached to the insulating part 11.

By constructing the supporting part 28C so as to be separate from the insulating part 11, it is possible to form the supporting part 28C and the insulating part 11 more accurately than in the integral construction. If the supporting part 28C and the insulating part 11 are formed to be integral with each other, a complex construction results, and the supporting part 28C and the insulating part 11 cannot be formed accurately. When an accurate formation is not possible, the connection holes cannot be properly formed with precision. In such a case, the test board cannot be adapted for the high-density, compact semiconductor device 16 having the fine-pitched projection electrodes 17.

The test board 10Q is constructed such that, by separating the supporting part 28C and the insulating part 11, the supporting part 28C and the insulating part 11 are formed properly. Accordingly, the test board 10Q is adapted for the fine-pitch construction of the semiconductor device 16.

A description will now be given of eighteenth and nineteenth embodiments of the present invention.

Figure 21:
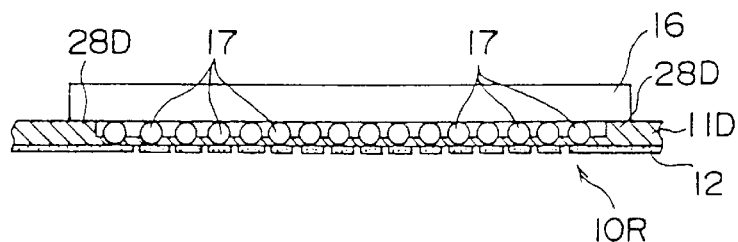
FIG. 21 is a sectional view of a test board according to an eighteenth embodiment of the present invention.
Figure 22:
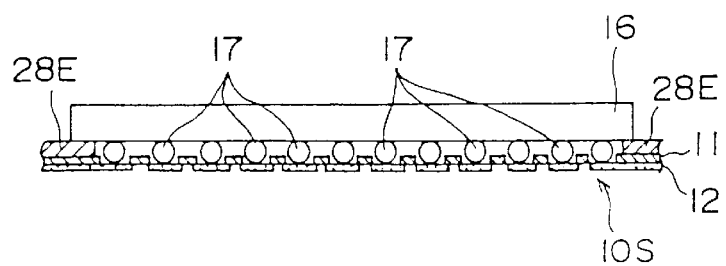
FIG. 22 is a sectional view of a test board according to a nineteenth embodiment of the present invention.

FIG. 21 shows a test board 10R according to the nineteenth embodiment. FIG. 22 shows a test board 10S according to a nineteenth embodiment. The eighteenth and nineteenth embodiments achieve the same objective as the test boards 10N, 10N-1, 10N-2 and 10N-3 according to the fifteenth embodiment.

In the fifteenth through seventeenth embodiments described previously, the supporting parts 28A, 20B and 28C are provided between the adjacent connection holes 13. Such a construction produces a relatively large pitch between the connection holes 13 and cannot be adapted for the semiconductor device 16 having fine-pitched projection electrodes 17.

In contrast, the eighteenth and nineteenth embodiments feature formation of supporting parts 28D and 28E, respectively, at the periphery of an area populated by the connection holes 13. According to such a construction, the connection holes 13 can be arranged at close distances from each other, resulting in the fine-pitched connection holes 13. Thus, the test boards 10R and 10S are adapted for the fine-pitched semiconductor device 16.

The test board 10R according to the eighteenth embodiment shown in FIG. 21 is constructed such that the supporting part 28D is formed to be integral with the insulating part 11D. The test board 10S is constructed such that the supporting part 28E is formed to be separate from the insulating part 11.

A description will now be given of twentieth and twenty-first embodiments of the present invention.

Figure 23:
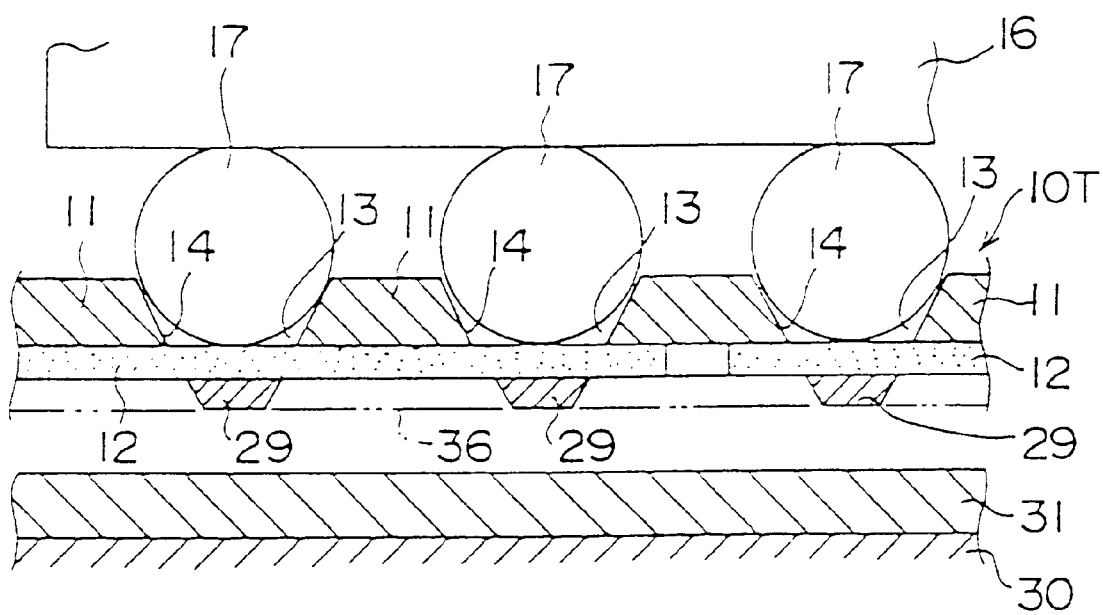
FIG. 23 is a sectional view showing a testing connection according to a twentieth embodiment of the present invention.
Figure 24:
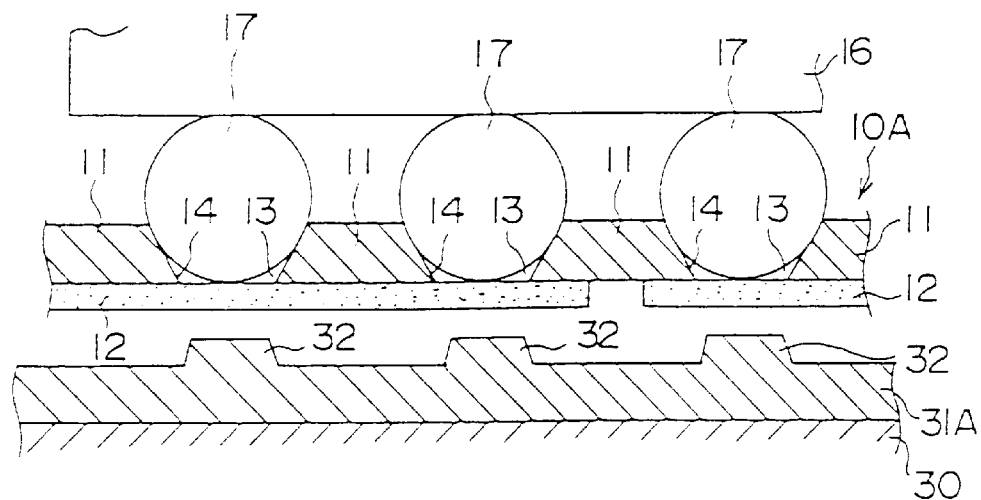
FIG. 24 is a sectional view showing a testing connection according to a twenty-first embodiment of the present invention.

FIG. 23 shows a testing connection according to the twentieth embodiment using a test board 10T, and FIG. 24 shows a testing connection according to the twenty-first embodiment using the test board 10A. The twentieth and twenty-first embodiments feature provision of a pressing mechanism for pressing that part of the conductive part 12 facing the connection holes 13 toward the projection electrode 17.

As described earlier, the connect pressure is properly distributed and deformation of the projection electrode 17 is prevented by constructing the projection electrode 17 to come into contact with the inner wall 14 of the connection hole 13 formed in the insulating part 11 so that the semiconductor device 16 is supported by the insulating part 11. Since the connect pressure is exerted in order to ensure electrical connection by pressing the projection electrode 17 against the conductive part 12, poor electrical connection between the projection electrode 17 and the conductive part 12 results if the connect pressure is received only by the insulating part 11.

For the purpose of preventing deformation of the projection electrode 17, the connect pressure is best supported only by the insulating part 11. However, for the purpose of ensuring electrical connection between the projection electrode 17 and the conductive part 12, the connect pressure is better applied to the projection electrode 17. Thus, the test board must meet the contradicting requirements.

In the twentieth and twenty-first embodiments, deformation of the projection electrode 17 is prevented by the insulating part 11 as is done in the foregoing embodiments. Electrical connection between the projection electrode 17 and the conductive part 12 is secured by providing a pressing mechanism.

In the twentieth embodiment shown in FIG. 23, the pressing mechanism is provided in the test board 10T. More specifically, an insulating projection 29 formed of an insulating material is formed to project from a rear surface of the conductive part opposite to a connection surface facing the projection electrode 17.

Like the insulating part 11, the insulating projection 29 may be formed of an insulating resin. The insulating projection part 29 may be formed such that an insulating resin film 36 (indicated by the dash line in FIG. 23) is formed on the entire underside of the conductive part 12, whereupon the insulating resin film 36 is removed except at those positions corresponding to the locations connected to the projection electrode 17. Removal of the insulating resin film 36 may be effected by anisotropic dry etching. Thus, the insulating projection 29 is easily formed.

Numeral 30 in FIG. 23 indicates a seat provided in a socket (not shown) on which the test board 10T is mounted. A pressurized sheet 31 is provided on the upper major surface of the seat 30. The test board 10T is placed on the pressurized sheet 31 when mounted on the socket. Thus, the insulating projection 29 is in contact with the pressurized sheet 31. It is to be noted that the pressurized sheet is formed of a material having a predetermined flexibility.

A description will now be given of how the semiconductor device 16 is mounted on the test board 10T. As described before, the connect pressure is exerted on the semiconductor device 16 in the mounting process. The test board 10T is constructed such that the connect pressure is supported largely by the insulating part 11 by appropriately selecting the angle of the inner wall 14 of the connection hole 13. Thus, deformation of the projection electrode 17 is properly prevented.

Since the connect pressure is supported by the insulating part 11, the test board 10T receives a downward pressure which caused the insulating projection 29 to be pressed against the pressurized sheet 31. A counter force for this downward pressure causes the conductive part 12 to be deformed toward the projection electrode 17. Accordingly, a proper electrical connection between the conductive part 12 and the projection electrode 17 is secured.

Thus, according to a simple construction of the twentieth embodiment, whereby the insulating projection 29 is provided to correspond to the location of the conductive part 12 connected to the projection electrode 17, the aforementioned two requirements are both met. That is, deformation of the projection electrode 17 is prevented, and an improved electrical connection between the conductive part 12 and the projection electrode 17 is secured. The pressure causing the conductive part 12 to be deformed toward the projection electrode 17 is adjustable by varying the flexibility of the pressurized sheet 31.

The twenty-first embodiment shown in FIG. 24 features formation of a projection 32 on a pressurized sheet 31A. The projection 32 is formed at a selected position corresponding to the location of the conductive part 12 connected to the projection electrode 17. In the testing connection of the twenty-first embodiment, the test board 10A according to the first embodiment is used.

In the twenty-first embodiment, the connect pressure exerted on the semiconductor device 16 mounted on the test board 10A causes the test board 10A to be pressed downward against the pressurized sheet 31A. Since the projection 32 is formed in the pressurized sheet 31A, the conductive part 12 is pressed against the projection 32 in response to the downward movement of the test board 10A.

Accordingly, the conductive part 12 is forced to be deformed toward the projection electrode 17, securing a proper electrical connection between the conductive part 12 and the projection electrode 17. Thus, the twenty-first embodiment also satisfies the aforementioned two requirements. That is, deformation of the projection electrode is prevented, and electrical connection between the conductive part 12 and the projection electrode 17 is improved.

A description will now be given of twenty-second and twenty-third embodiments of the present invention.

Figure 25:
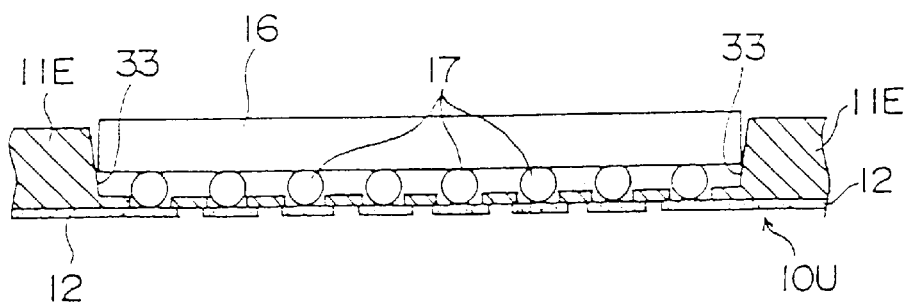
FIG. 25 is a sectional view of a test board according to a twenty-second embodiment of the present invention.
Figure 26:
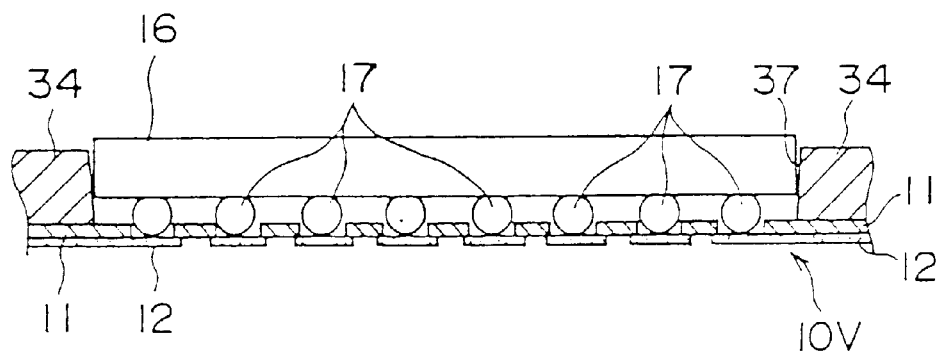
FIG. 26 is a sectional view of a test board according to a twenty-third embodiment of the present invention.

FIG. 25 shows a test board 10U according to a twenty-second embodiment, and FIG. 26 shows a test board 10V according to a twenty-third embodiment. The test boards 10U and 10V feature provision of a positioning mechanism for positioning the projection electrode 17 with respect to the connection hole 13.

The test board 10U features formation of a positioning surface 33 in an insulating part 11E at the periphery of an area populated by the connection holes 13. The positioning surface 33 is configured to be adapted for the configuration of the semiconductor device 16 and is tapered so as to facilitate the mounting of the semiconductor device 16. Accordingly, a simple operation of guiding the semiconductor device 16 along the positioning surface 33 provided in the test board 10U ensures that the projection electrode 17 is properly inserted into the connection holes 13. Thus, the mounting operation is performed easily.

The test board 10V features a separate positioning member 34 for positioning the projection electrode 17 with respect to the connection hole 13. The positioning member 34 is formed on the upper major surface of the insulating part 11. The positioning member 34 has a positioning hole 37 for positioning the semiconductor device 16. A simple operation guiding the semiconductor device 16 along the positioning hole 37 provided in the test board 10V ensures that the projection electrode 17 is properly inserted into the connection hole 13. Thus, the mounting operation is performed easily.

A description will now be given of a twenty-fourth embodiment of the present invention.

Figures 27A, 27B:
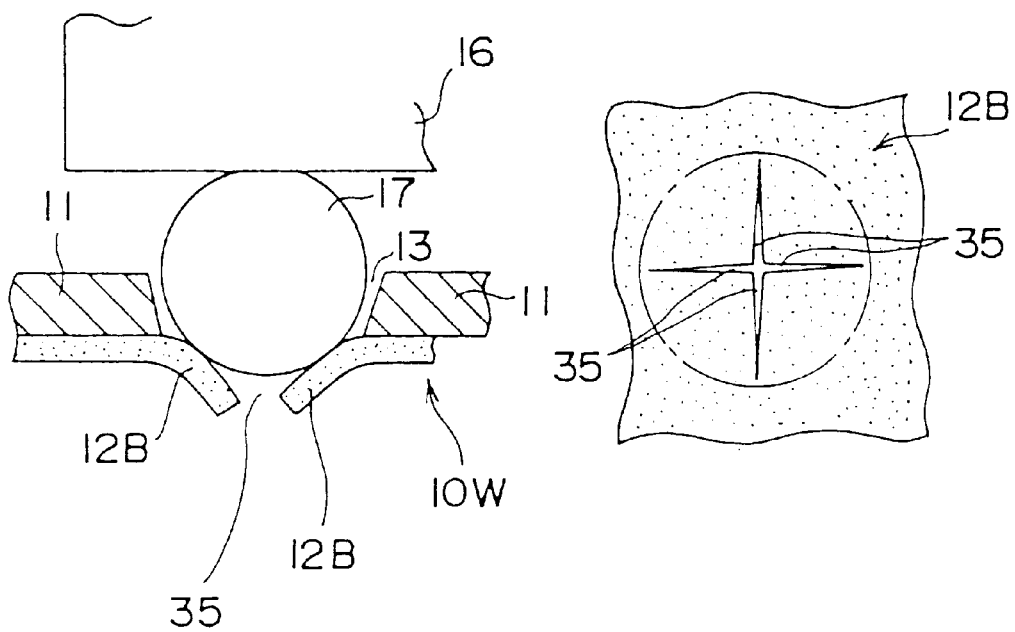
FIG. 27A is a sectional view of a test board according to a twenty-fourth embodiment of the present invention.
FIG. 27B is a bottom view of the test board according to the twenty-fourth embodiment.

FIG. 27A is an enlarged sectional view showing a part of a test board 10W according to the twenty-fourth embodiment. FIG. 27B is an enlarged bottom view of a part of the test board 10W.

The test board 10W features formation of a slit 35 on that part of a conductive part 12B which is in contact with the projection electrode 17 so that the conductive part 12B is deformable around the slit 35. The slit 35 may be cross-shaped or has other configurations. The deformability of the conductive part 12B is controlled depending on the configuration of the slit 35 and the elasticity of the conductive part 12B.

By forming the slit 35, the conductive part 12B is deformed by the pressure from the projection electrode 17 when the semiconductor device 16 is mounted on the test board 10W. Since the conductive part 12B is deformed, the connect pressure exerted on the projection electrode 17 is canceled and the area of contact between the conductive part 12B and the projection electrode 17 is increased. Accordingly, the dual objectives of preventing deformation of the projection electrode 17 and improving electrical connection between the projection electrode 17 and the conductive part 12B are achieved.

The present invention is not limited to the above described embodiments, and variations and modifications may be made without departing from the scope of the present invention.

What is claimed is:

1. A test board for testing a device having projection electrodes and mounted on the test board for testing, comprising:

insulating parts facing the device mounted on the test board so as to support one of the device and the projection electrodes of the device when the device is mounted on the test board;

connection holes formed in the insulating parts so as to accept the respective projection electrodes; and conductive parts formed on a surface of the respective insulating parts which surface is opposite to a surface facing the device, and electrically connected to the respective projection electrodes by physical contact.

2. A test board as claimed in claim 1, wherein an inner wall of each of the connection holes is sloped.

3. A test board as claimed in claim 1, wherein an inner wall of each of the connection holes is configured to fit the respective projection electrodes.

4. A test board as claimed in claim 1, wherein each of the conductive parts is provided inside the insulating parts so as to be exposed in the connection holes for electrical connection with the associated projection electrode.

5. A test board as claimed in claim 1, wherein an inner wall of each of the connection holes is provided with a conductive film electrically connected to the conductive part.

6. A test board as claimed in claim 1, wherein a projecting connection part electrically connected to the conductive part and projecting therefrom is provided at a bottom of each of the connection holes.

7. A test board as claimed in claim 6, wherein the projecting connection part is one of a non-wettable member, a stud bump, a conductive pin and a coarse-surfaced member.

8. A test board as claimed in claim 6, wherein the projection electrodes include first projection electrodes not used in a test and second projection electrodes used in a test, each connection hole is provided only at a position of the insulating parts which position faces the second projection electrode, and a thickness of each of the insulating parts is set such that each of the second projection electrodes is connected to the projecting connection part when the first projection electrodes are in contact with the respective insulating parts.

9. A test board as claimed in claim 6, wherein the projection electrodes include first projection electrodes not used in a test and second projection electrodes used in a test, each connection hole is provided only at a position of the insulating parts which position faces the second projection electrode, each of the insulating parts is provided with a recess facing the first projection electrode, and a depth of the recess is set such that each of the second projection electrodes is connected to the projecting connection part when the first projection electrodes are in contact with the respective recesses.

10. A test board as claimed in claim 1, wherein the conductive parts include first conductive parts and second conductive parts that are electrically separated from each other, the projection electrodes include first projection electrodes not used in a test and second projection electrodes used in a test, and each of the first conductive parts is connected to the first projection electrode, and each of the second conductive parts is connected to the second projection electrodes.

11. A test board as claimed in claim 1, wherein the projection electrodes include first projection electrodes not used in a test and second projection electrodes used in a test, and the conductive parts are provided only in the connection holes in which the respective second projection electrodes are inserted.

12. A test board as claimed in claim 1, wherein each of said insulating parts is provided with a support part which comes into contact with the device when the device is properly mounted on the test board.

13. A test board as claimed in claim 12, wherein the support part is provided between adjacent connection holes.

14. A test board as claimed in claim 12, wherein the support part is provided at a periphery of each of the connection holes.

15. A test board as claimed in claim 12, wherein the support part is separate from the insulating part.

16. A test board as claimed in claim 1, wherein each of said insulating parts is provided with a support part which is separated from the device by a minute distance when the device is properly mounted on the test board.

17. A test board as claimed in claim 16, wherein the support part is provided between adjacent connection holes.

18. A test board as claimed in claim 16, wherein the support part is provided at a periphery of each of the connection holes.

19. A test board as claimed in claim 16, wherein the support part is separate from the insulating part.

20. A test board as claimed in claim 1, further comprising a thrusting mechanism for thrusting each of the conductive parts against the projection electrodes inserted in the connection holes, in response to a force exerted when the device is mounted on the test board for testing.

21. A test board as claimed in claim 20, wherein the thrusting mechanism is an insulating projection formed of an insulating material and projecting from a surface of each of the conductive parts which surface is opposite to a surface connected to the projection electrodes.

22. A test board as claimed in claim 1, wherein each of the insulating parts is provided with a positioning mechanism for positioning the projection electrodes and the connection hole.

23. A test board as claimed in claim 1, wherein each of said insulating parts is a film formed of a polyimide.

24. A test method for testing a device having projection electrodes, by mounting the device on a test board provided with insulating parts facing the device mounted on the test board, connection holes formed in the insulating parts for accepting the projection electrodes, and conductive parts underlying the respective connection holes and being integrally fixed to the insulating parts, comprising the steps of:

inserting each of the projection electrodes in the connection holes, wherein each of the connection holes has a tapered portion so as to connect the projection electrodes to the conductive parts therein; and supporting one of the device and the projection electrodes of the device by each of the insulating parts, when the device is mounted on the test board.

25. A test method as claimed in claim 24, wherein each of the insulating parts is provided with a positioning mechanism for positioning the projection electrodes and the connection holes.

26. A test method as claimed in claim 24, wherein each of the conductive parts is formed inside the insulating part and exposed in the connection hole for electrical connection with the associated projection electrode.

27. A test method as claimed in claim 24, wherein an inner wall of each of the connection holes is provided with a conductive film electrically connected to the conductive part.

28. A test method as claimed in claim 24, wherein a projecting connection part electrically connected to the conductive part and projecting therefrom is provided at a bottom of each of the connection holes.

29. A test method as claimed in claim 24, wherein the conductive parts include first conductive parts and second conductive parts that are electrically separated from each other, the projection electrodes include first projection electrodes not used in a test and second projection electrodes used in a test, and each of the first conductive parts is connected to the first projection electrode, and each of the second conductive parts is connected to the second projection electrodes.

30. A test method as claimed in claim 24, wherein the projection electrodes include first projection electrodes not used in a test and second projection electrodes used in a test, and the conductive parts are provided only in the connection holes in which the respective second projection electrodes are inserted.

31. A test method as claimed in claim 24, wherein each of said insulating parts is provided with a support part which comes into contact with the device when the device is properly mounted on the test board.

32. A test method as claimed in claim 24, wherein each of said insulating parts is provided with a support part which is separated from the device by a minute distance when the device is properly mounted on the test board.

33. A test method as claimed in claim 24, wherein the test board further comprises a thrusting mechanism for thrusting each of the conductive parts against the projection electrodes inserted in the connection holes, in response to a force exerted when the device is mounted on the test board for testing.

* * * * *

UNITED STATES PATENT AND TRADEMARK OFFICE
CERTIFICATE OF CORRECTION

PATENT NO.    : 6,046,598
DATED         : April 4, 2000
INVENTOR(S)   : Miyaji et al.

It is certified that error appears in the above-identified patent and that said Letters Patent is hereby corrected as shown below:

Title page,
After Item [22], insert Item [63] as follows:
-- Related U.S. Application Data

[63]   Continuation-in-part of Ser. No. 08/531,449, September 21, 1995, Pat. No. 5,584,558. --.

Item [30], Foreign Application Priority Data, insert
-- Nov. 18, 1994 [JP]   Japan ............6-285342 --.

Signed and Sealed this

Eleventh Day of November, 2003

JAMES E. ROGAN
*Director of the United States Patent and Trademark Office*